US005637188A

United States Patent [19]

Amme et al.

[11] Patent Number: 5,637,188

[45] Date of Patent: Jun. 10, 1997

[54] PROCESSING SUBSTRATES WITH A PHOTON-ENHANCED NEUTRAL BEAM

[75] Inventors: Robert C. Amme; Bert Van Zyl, both of Littleton, Colo.

[73] Assignee: Colorado Seminary, Denver, Colo.

[21] Appl. No.: 393,154

[22] Filed: Feb. 17, 1995

[51] Int. Cl.$^6$ .......... H01L 21/00

[52] U.S. Cl. .......... 438/708; 216/66

[58] Field of Search .......... 156/643.1, 646.1; 216/65, 66, 67

[56] References Cited

U.S. PATENT DOCUMENTS

| | | | |
|---|---|---|---|
| 4,662,977 | 5/1987 | Motley et al. | 156/345 |
| 4,780,608 | 10/1988 | Cross et al. | 250/281 |
| 4,901,667 | 2/1990 | Suzuki et al. | 118/719 |
| 4,920,094 | 4/1990 | Nogawa et al. | 505/1 |
| 5,009,743 | 4/1991 | Swann | 216/66 |
| 5,188,671 | 2/1993 | Zinck et al. | 118/715 |
| 5,217,559 | 6/1993 | Moslehi et al. | 216/66 |
| 5,284,544 | 2/1994 | Mizutani et al. | 156/345 |

OTHER PUBLICATIONS

"New Molecular–dissociation furnace for H and O atom sources" by Bert Van Zyl and M.W. Gealy, Nov. 10, 1985, Review of Scientific Instruments 57 (3).

*Primary Examiner*—T. Tung
*Attorney, Agent, or Firm*—Dorr, Carson, Sloan & Birney, P.C.

[57] ABSTRACT

An apparatus for processing substrates, the apparatus including a plurality of molecular dissociation furnaces. Each dissociation furnace produces a directed beam of neutral dissociated reactive species. Each reactive beam is directed at a surface of the semiconductor substrate. A photon source is also directed at the surface of the semiconductor substrate. The intensity and wavelength of the photon source are selected to enhance the reaction rate over that of the reactive beam acting alone on the surface.

13 Claims, 6 Drawing Sheets

PROCESSING SUBSTRATES WITH A PHOTON-ENHANCED NEUTRAL BEAM

BACKGROUND OF THE INVENTION

1. Field of the Invention

The present invention relates generally to the field of surface etching and cleaning. More particularly, the present invention relates to a method and apparatus for etching and cleaning surfaces, especially semiconductor substrates, using photon-enhanced neutral atomic beam surface reactions.

2. Statement of the Problem

Dry and wet etching and cleaning processes are widely used in the semiconductor industry for etching and cleaning semiconductor substrates. It is important that cleaning and etching processes do not damage the semiconductor substrate, are capable of etching anisotropically, and yet do not damage the process apparatus or micron-scale features formed on the semiconductor substrate. Also, the etching apparatus is desirably easily scaled to process many substrate sizes, including large area wafers that are 200 millimeters or more in diameter.

Plasma and wet chemical processes require production, transportation, and storage of a variety of highly reactive and toxic materials such as acids, chloro fluorocarbons, fluorine, and chlorine, for example. These materials create a personal and environmental hazard. A need exists to etch, clean, and deposit films on substrates using processes with reagent gases having reduced toxicity and reactivity and processes compatible with storage of the reactant species in a low reactivity state.

Dry etching often uses atomic oxygen plasmas to remove photoresists and clean hydrocarbon films from substrates. Atomic oxygen plasmas are formed at low pressure (about 10 Torr) and can be initiated using a direct current (DC) or alternating current (AC) field that creates oxygen ions. A serious limitation of plasma processing is that the energy of the plasma system can damage the substrate being processed. To achieve highly anisotropic etching required for modern high aspect ratio devices, the oxygen ions must be accelerated to high energy. Hence, to achieve anisotropic etching the substrate is exposed to higher levels of radiation and high frequency energy. A need exists for a method and apparatus to treat surfaces with highly directional beam for high anisotropy and high aspect ratio feature fabrication without using the high levels of radiation and high frequency energy required in plasma processing.

Although plasma processing techniques provide high quality etching and deposition, they require a large amount of process gases. In fact, only a small percentage of these process gases are activated (i.e., brought to an energy state sufficient to chemically react) and participate in useful chemical reactions. Hence, a large portion of the process gases is wasted. Even worse, a large portion of the process gases actually etch and damage the reaction chamber containing the plasma, requiring frequent maintenance. A need exists for an etching, cleaning and deposition technology that reduces the gas load of the reactor to use less of the reactant gases and produce less toxic waste while simplifying the processing apparatus. Similarly, a need exists to reduce exposure of the apparatus itself to the harmful effects of plasmas, radiation, and highly reactive ions.

Another side effect of plasma processing is that the substrate that is being processed is often exposed to the high temperature and radiation of the plasma. Semiconductor devices with fine geometry features can easily be damaged by the temperatures and radiation. For example, it is well known that thin gate oxides can be ruptured or permanently damaged by hot electron injection into the oxide during plasma etching. Also, because the plasma creates a wide variety of reactive species and ions due to the variety of reactions that take place, the surface of the substrate is exposed to all of the reactive species. Often, some of these reactive species create unpredictable and undesirable process variations. Again using the gate oxide structure, it is known that hydrogen ions can be tapped in thin oxide films during plasma etching or cleaning thereby creating unpredictable electrical performance. Further, high temperatures severely limit the kinds of processes which are available. Substrates having metal structures, polyamide structures, or soft glass structures cannot be exposed to high temperatures. A need exists to treat surfaces with reactant neutral atoms that avoids or minimizes the substrates' exposure to high temperatures, radiation, and plasma fields.

An apparatus for producing a single beam of atomic oxygen is described in a paper entitled "New Molecular—Dissociation Furnace for H & O Atom Sources" by Bert Van Zyl and M. W. Gealy published Nov. 10, 1985 in Review of Scientific Instruments 57, (3). This article describes a molecular dissociation furnace which produces a single atomic beam using an electron bombarded furnace tube. While the single beam apparatus was useful in research studies on atomic beams, it was inapplicable to commercial applications requiring treatment of a large surface area.

U.S. Pat. No. 4,662,977 issued May 5, 1987 to Motley et al. describes a neutral beam processing apparatus that uses an ionizing plasma to create ionic reactants and form them into a beam and then neutralizes the ion beam. Like the apparatus described in the Van Zyl/Gealy article, this atomic beam is difficult to scale and suffers many of the difficulties of plasma processing because plasma fields are involved.

U.S. Pat. No. 4,780,608 issued to Cross et al. on Oct. 25, 1988 illustrates an atomic beam apparatus using a sustained laser discharge to dissociate oxygen molecules into oxygen atoms. The neutral oxygen atoms are formed into a beam; however, the beam apparatus is not easily scaled for processing large diameter substrates.

U.S. Pat. No. 5,188,671 issued to Zinck et al. on Feb. 23, 1993 and U.S. Pat. No. 4,901,667 issued to Suzuki et al. on Feb. 20, 1990 describe molecular beam apparatus for forming large and small area molecular beams. Molecular beams can be formed at lower temperature than atomic beams since there is no need to dissociate the molecules into atoms. Molecular beams thus require either more reactive chemicals or subsequent plasma or thermal enhancement to cause reactions at the substrate.

U.S. Pat. No. 4,920,094 issued to Nagawa et al. on Apr. 24, 1990 illustrates a superconducting thin film deposition apparatus that uses neutral beams in a sputtering apparatus. The neutral oxygen beam is formed by oxygen ionization and subsequent neutralization and so suffers the difficulties of any plasma processing system.

U.S. Pat. No. 5,284,544 issued to Mizutani et al. on Feb. 8, 1994 describes a neutral beam generating apparatus that creates an ion beam using a plasma reactor that neutralizes the ion beam before treating a surface. The Mizutani method uses a microwave plasma generator and combines a neutral beam with a radical supply source from the plasma to encourage surface treatment. Ions are prevented from reaching the surface by an ion screen or grid; the latter, however, is subject to sputtering and erosion, which can contaminate the surface being treated.

3. Solution to the Problem

The above-identified problems are solved by a method and apparatus that generates a plurality of low-energy reactive neutral beams at a semiconductor substrate. The neutral reactive beams are generated by dissociation and are directed to the semiconductor substrate to etch or clean without electrical or radiation damage associated with plasma processing. Because any number of beams may be used, the process and apparatus are scaleable to any substrate size. The neutral reactive beams are highly directional even at low energy, and so avoid physical damage to the substrate. Because the beam is highly directional and can be fairly uniform chemically, a large portion of the generated beam participates in desired reactions thereby minimizing the gas load on the processing apparatus and minimizing waste gas production. Also, the reactant species can often be stored as a low reactivity molecule in the preferred embodiment, minimizing the hazards of production, transportation, and storage of the reagent chemicals.

SUMMARY OF THE INVENTION

Briefly stated, the present invention involves apparatus for processing semiconductor substrates including a plurality of molecular dissociation furnaces, each dissociation furnace producing a directed beam of neutral reactant atoms or radicals. Each reactive beam is directed at a surface of the semiconductor substrate. A photon source is also directed at the surface of the semiconductor substrate. The energy and wavelength of the photon source is selected to enhance the reaction rate over that of the reactive beam alone. The intensity and wavelength of the photon source is selected to optimize the desired process without producing the potentially damaging effects of ions and electrons.

DETAILED DESCRIPTION OF THE INVENTION

1. Overview

Figure 1:
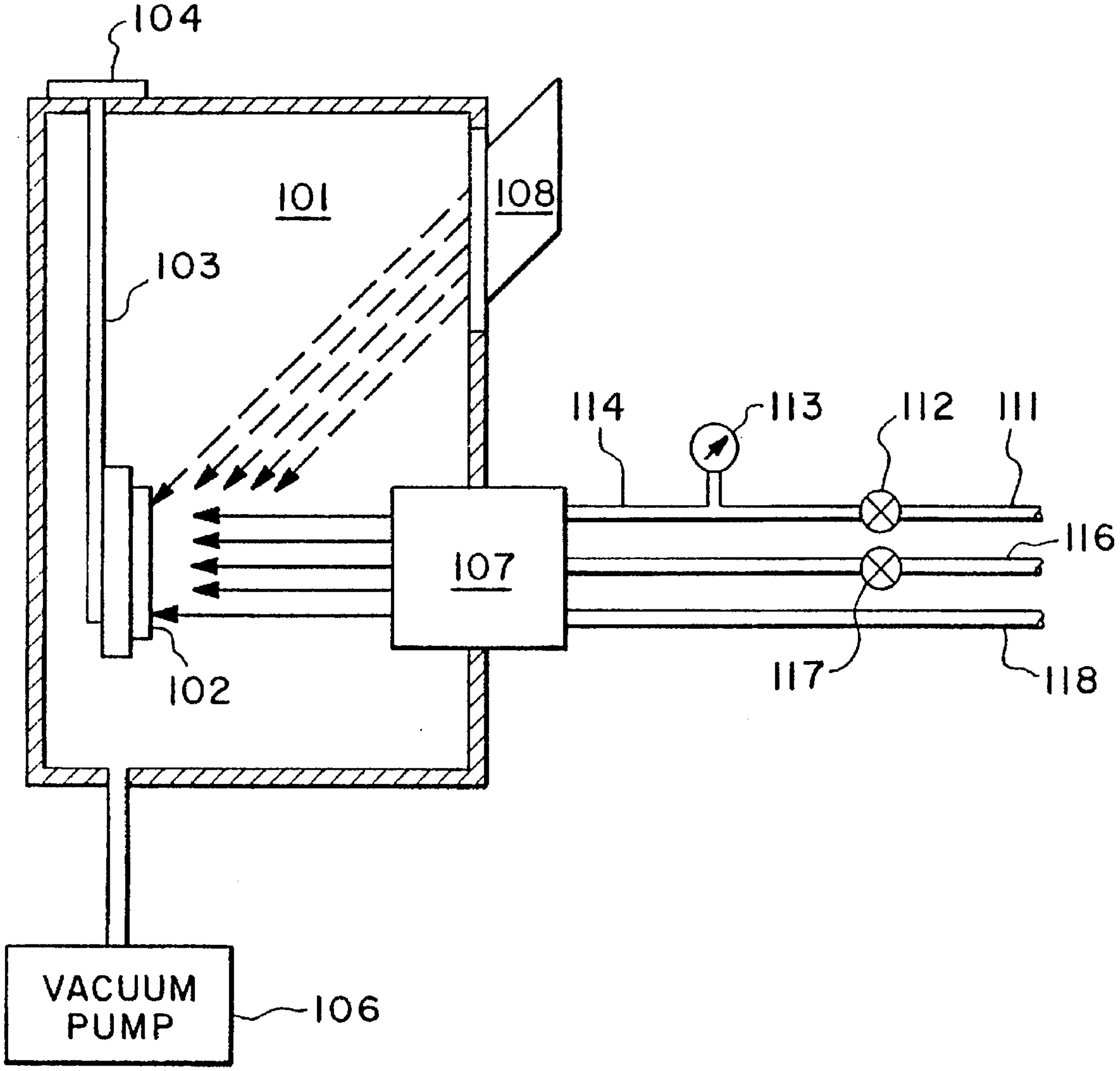
FIG. 1 illustrates in simplified schematic form a neutral reactive beam device in accordance with the present invention.

Turning to FIG. 1, a simplified schematic of a neutral atomic beam reactor is shown in cross section. It should be understood that the reactor shown in FIG. 1 is greatly simplified to show the major components of the method and apparatus in accordance with the present invention, and that none of the elements shown in FIG. 1 are to scale. Also, other components for optimizing and monitoring the processes are well known in conventional semiconductor processing equipment and may be incorporated with the elements set out in FIG. 1.

Major components of the neutral beam reactor in accordance with the present invention are vacuum chamber 101 in which a substrate support 103 is mounted to hold substrate 102. Access port 104 allows substrate 102 to be placed in and removed from vacuum chamber 101. Vacuum chamber 101 is maintained at a reduced pressure by vacuum pump 106. Preferably, vacuum chamber 101 is held at about $3\times10^{-8}$ Torr, although other pressures may be used depending on the demands of a particular application.

Neutral beam generator 107 provides plurality of neutral reactant beams directed at substrate 102. Preferably the neutral reactant beams are directed into vacuum chamber 101 and have a gas density of approximately 100 times the background density in vacuum chamber 101. As suggested by the arrows in FIG. 1, each beam is directed towards the surface of substrate 102 and a sufficient number of beams are provided so that the entire surface of substrate 102 is treated at the same time. Alternatively, the cross-sectional area of the neutral beams leaving neutral beam generator 107 can be smaller, and wafer or substrate 102 rotated or indexed that the entire surface area of substrate 102 intersects the reactant beams.

Neutral beam generator 107 receives reagent gases through input gas line 111 which preferably provides molecules of the reagent gas (i.e., molecules which will eventually produce the neutral dissociated beam). Valve 112 regulates the pressure supplied to the reservoir side 114 of reagent gas line 111. The reservoir pressure is monitored by gauge 113 as reservoir pressure is an important variable for process control in accordance with the present invention. Typical reservoir pressure is about 0.05 Torr to 0.10 Torr for a typical operation, although this range can be varied to meet the needs of a particular application.

A vacuum or exhaust line 116 is also supplied through valve 117 to neutral beam generator 107. Vacuum line 116 serves to exhaust undesirable contaminants from the neutral beam generator, such as air or residual water vapor. Exhaust or vacuum outlet 116 serves to provide a higher purity reactant beam and may be omitted if a lower purity beam will suffice. Power line 118 provides high current to drive the heating sources described hereinafter and high voltage for ion filters described in greater detail hereinafter.

An optional yet desirable feature in accordance with the present invention is photon source 108 which provides photons of a preselected wavelength and intensity directed at substrate 102. The photons, indicated by dashed lines with arrowheads in FIG. 1, interact with the surface of substrate 102 simultaneously with the neutral dissociated beams, to enhance the reaction caused by the neutral beam. Photon source 108 may or may not be used as some reactions will be performed adequately with the neutral beams alone. The particular wavelength of photons generated by photon source 108 may be in the visible or ultraviolet range depending on the particular chemical reaction desired. For example, ultraviolet photons are known to enhance oxidation of carbon and so would enhance a photo resist removal or cleaning process when the neutral atomic beams comprise atomic oxygen. Visible light will enhance other reactions.

Although a single photon source 108 is illustrated, it should be understood that multiple sources may be provided. Photon source 108 may provide constant or pulsed emission. Further, photon source 108 may provide narrow or broad bandwidth photons to substrate 102 depending on the particular needs of an application. It is also possible to use a narrow beam photon source such as a laser or focused light to direct photons to only a small portion of substrate 102. Such a narrow beam photon source can be scanned or rastered across the surface of substrate 102 to etch or deposit patterns onto substrate 102. All of these modifications are within the inventive concept of the present invention.

Although the preferred embodiment is described in terms of an etching or cleaning process using neutral reactant beams, it should be understood that deposition processes are known which could also take advantage of the neutral beam reactor shown in FIG. 1. For example, a conventional sputtering or evaporation process could be incorporated within vacuum chamber 101 allowing the neutral atomic beam and photon source 108 to interact with the sputtered or deposited material to form thin films on substrate 102. Similarly, additional reactant gases may be provided in vacuum chamber 101 or directed to the surface of substrate 102 allowing the directed neutral beam to interact with the additional reactant gases to form products that deposit onto substrate 102 to form a thin film. Accordingly, the present invention is not limited to the particular embodiment shown in FIG. 1, but incorporates the modifications that would be or that are apparent to those of skill in the art within the scope and spirit of the present invention.

2. Single Neutral Beam Furnace

Figure 2:
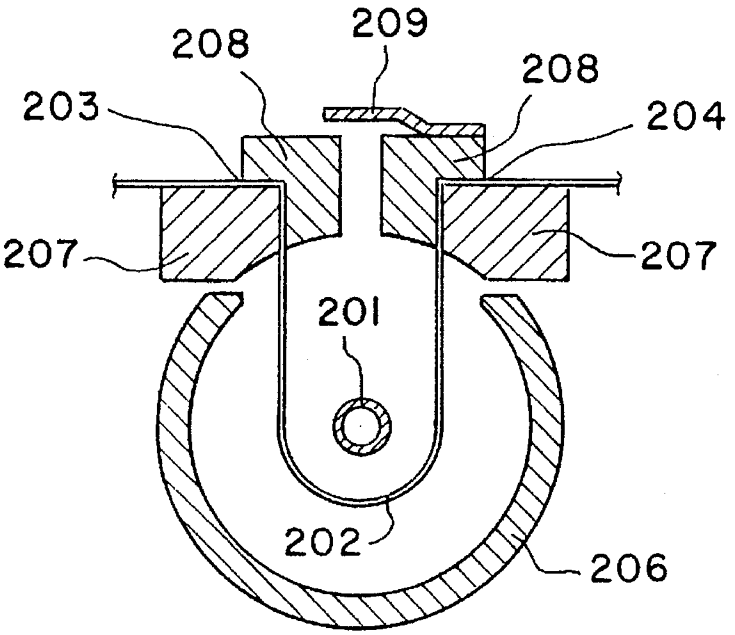
Fig. 2 (Prior Art)
FIG. 2 is a cross-section view of a prior art neutral beam furnace in accordance with a first embodiment of the present invention.
Figure 3:
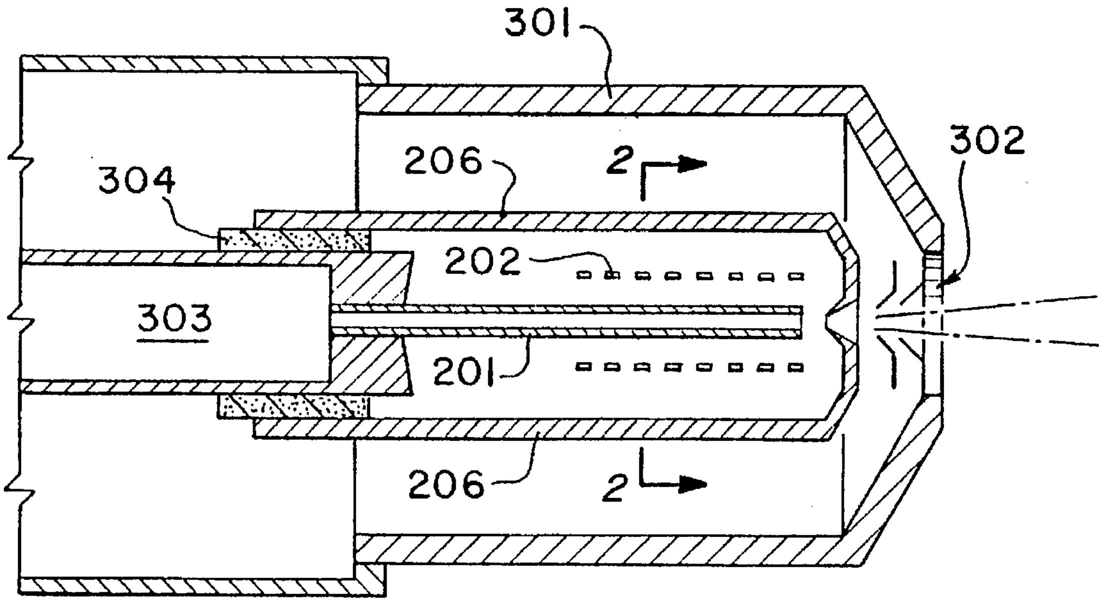
Fig. 3 (Prior Art)
FIG. 3 is a cross-section view of the prior art neutral beam furnace of FIG. 2 taken orthogonally to the view of FIG, 2.

FIG. 2 and FIG. 3 illustrate prior art neutral beam furnaces which could be used in neutral beam generator 107 shown in FIG. 1. It should be understood that the prior art neutral beam generators were designed for experimental use, and never intended to be wide area neutral beam generators such as shown in generator 107 in FIG. 1. Nevertheless, understanding of the basic experimental neutral beam generator is important to the understanding of a wide beam generator in accordance with the present invention.

At the core of neutral beam furnace shown in FIG. 2 is a furnace tube 201 that is a small diameter metal tube about 7 to 8 centimeters long. In a particular example, the furnace tube has a 0.25 centimeter inside diameter and about a 0.32 centimeter outside diameter. It is desirable to reduce the inside diameter to narrow and increase the directionality of the output atomic beam. However, cost of fabricating smaller diameter tubes increase dramatically and so the particular size chosen will be a trade-off between cost and performance. The material for furnace tube 201 should be selected to be resistant to both the reagent gas molecules and the neutral reactive species produced in the furnace. Also, the furnace tube must be able to withstand high temperature and high temperature gradients required to dissociate the reagent molecules.

Furnace tube 201 is surrounded by filament 202 which is a thoria coated iridium filament or of other material appropriate to the reagent employed. As shown in FIG. 3, the filaments cover only a portion of the length of furnace tube 201. Current passes through filament 202 from terminals 203 to 204. Filament 202 is heated by the flowing current resulting in electrons that boil from the surface of filament 202 and bombard furnace tube 201. The electron bombardment heats the portion of furnace tube 201 that is near filament 202 to extremely high temperatures. Significantly, the electron bombardment heating avoids creating a plasma inside furnace tube 201 and allows the dissociation of the reagent molecules to take place without the degrading side effects of high frequency energy or plasmas.

Filament 202 is surrounded by a water cooled shield 206 which captures electrons emitted from the outside of filament 202. Furnace tube 201 is biased to a very large positive potential of about +500 to +1000 volts relative to filaments 202 and so the bulk of electrons emitted from filaments 202 are accelerated by the field to the outer wall of furnace tube 201. However, radiant energy is emitted outward from filament 202 and is reflected back to furnace tube 201 by the water cooled heat shield and radiation reflector 206. Cooling is necessary to remove stray heat from the furnace.

A convenient way of holding filament 202 is through filament clamps made up of a water cooled conductor 207 and a clamp portion 208. This clamp arrangement is merely for convenience and a wide variety of other filament clamp methods may be used to create the electron bombardment furnace in accordance with the present invention. A radiation reflector 209 caps the separation between filament clamps 208. Radiation reflector 209 is merely a small extension of metal that reflects heat and radiation back towards furnace tube 201 and thus minimizes thermal emission from the body of the furnace tube.

FIG. 3 shows a cross section taken orthogonally through the prior art furnace tube. In addition to the components shown in FIG. 2, an external housing 301 is shown surrounding the water cooled heat shield and radiation reflector 206. Housing 301 tapers down towards the exit end of the atomic beam furnace to provide one or more apertures 302. Apertures 302 serve to shape the beam exiting furnace tube 201 and provide for needed differential pumping between the high-pressure furnace chamber and lower pressure processing chamber.

It can be seen that a number of filaments 202 are arranged along the length of furnace tube 201. Filaments 202 surround only the exit end of furnace tube 201 so that only about half of furnace tube 201 is heated by filaments 202.

At the opposite end of furnace tube 201 is water cooled reservoir 303. Reservoir 303 is coupled to a reagent molecule inlet similar to line 111 shown in FIG. 1. Reservoir holds reagent gas molecules at a relatively cool temperature compared to the exit end of furnace tube 201. Water cooled heat shield and radiation reflector 206 is coupled to reservoir 303 by ceramic insulating members 304 to electrically isolate reservoir 303 and furnace tube 201 from heat shield and radiation reflector 206.

In operation, reagent gas molecules flow from reservoir 303 into furnace tube 201. The flow rate is controlled by controlling the pressure in reservoir 303. Reagent gas molecules flow through furnace tube 201 to the heated end. The heated end is preferably operated at a temperature sufficient to dissociate the reagent gas molecules into neutral species. For $O_2$ dissociation this is done at temperatures in the range of 1500 K to 2400 K. It should be noted that the temperature gradient from the exit end of furnace tube 201 to the water cooled reservoir 303 is significant and should be considered in selecting a material for furnace tube 201. In the heated region of furnace tube 201, the reagent gas molecules dissociate into neutral atoms or radicals and move rapidly because of the high thermal energy. The neutral species interact with the inner wall of furnace tube 201 bouncing and deflecting from the inner surface of furnace tube 201. Because of the small diameter of furnace tube 201, the neutrals which actually escape from the exit end are highly directional and have a narrow angular distribution.

Some of the reagent molecules may exit the furnace tube 201 before dissociation. These are largely diverted by apertures 302 and removed from the system through a vacuum pump attached to the space between heat shield 206 and housing 301. Any ions which may have been formed in furnace tube 201 can be captured by positive and negative ion screening electrodes placed around the exit of the beam from the furnace tube 201. Thus, the beam leaving furnace tube 201 is a greatly dissociated neutral beam with a high degree of directionality.

However, as stated before, the narrow single beam has little application for the large surface area treatment required for semiconductor etching, cleaning, and film depositions. In accordance with the present invention, described below, the modifications and improvements to the prior art furnace assembly allow the neutral beam apparatus to be scaled to provide a wide cross section beam capable of efficient processing of semiconductor substrates.

3. Large Area Neutral Atomic Beam

Figure 4:
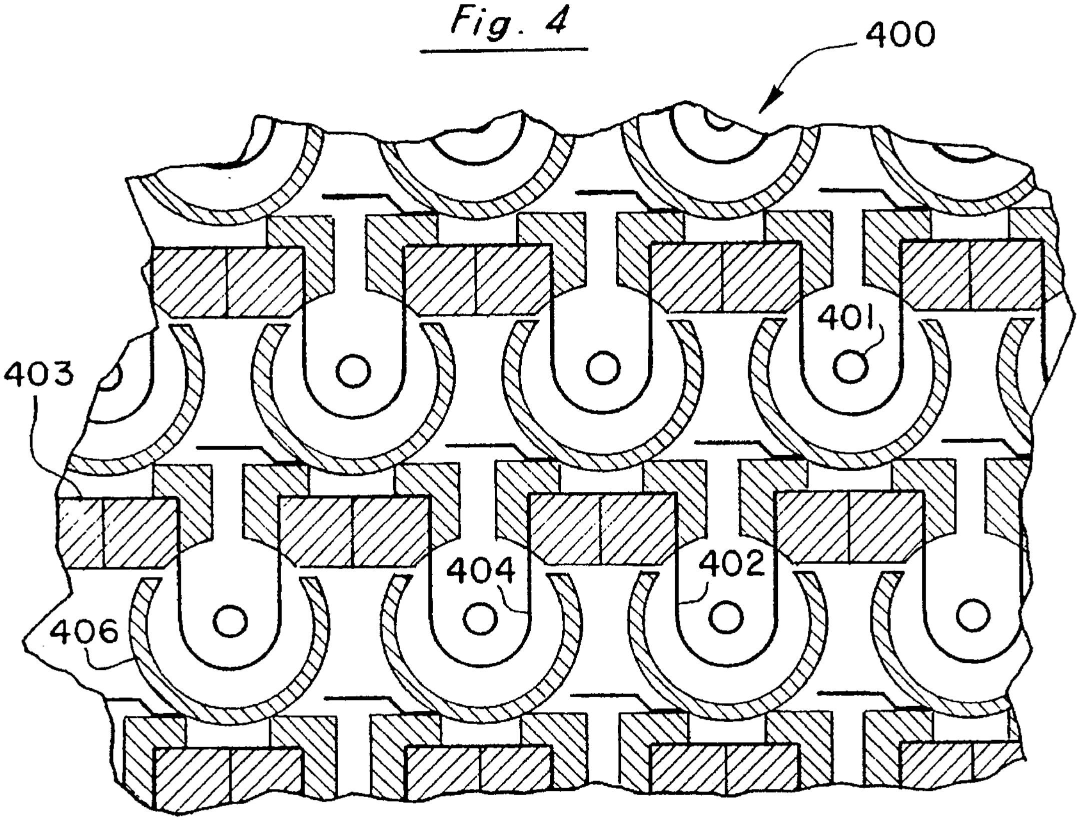
FIG. 4 illustrates a two dimensional array of the furnace tubes shown in FIG. 2.

FIG. 4 illustrates an array 400 of furnace assemblies capable of providing a highly directional large area source of neutral atoms in accordance with the present invention. Each of the furnace assemblies in the array is similar to the basic furnace shown in FIG. 2 and FIG. 3. This is perhaps the most straight forward way of providing a multiple beam furnace apparatus by placing a number of individual beam furnaces in a two dimensional array. Each furnace in array 400 comprises a furnace tube 401 which is similar to furnace tube 201 shown in FIG. 2. Furnace tubes 401 are surrounded by filaments 402 and then are similar to filaments 202 shown in FIG. 2. To simplify the electrical connection required to power filaments 402, a plurality of filaments 402 are coupled in series so that current passed from terminal 403 to terminal 404 will supply power to heat a number of series coupled filaments 402. It should be understood that the electrical interconnection for an array of furnaces can be accomplished in a number of ways and the particular connection shown in FIG. 4 is merely an example of a simple electrical connection.

Although not shown in FIG. 4, the multiple furnace tubes 401 may each have individual reservoirs or may be coupled to a single reservoir to ease pressure control. Usually it will be advantageous to provide a single reservoir since most applications would require the output of each furnace tube 401 to be approximately the same for process uniformity.

Figure 5:
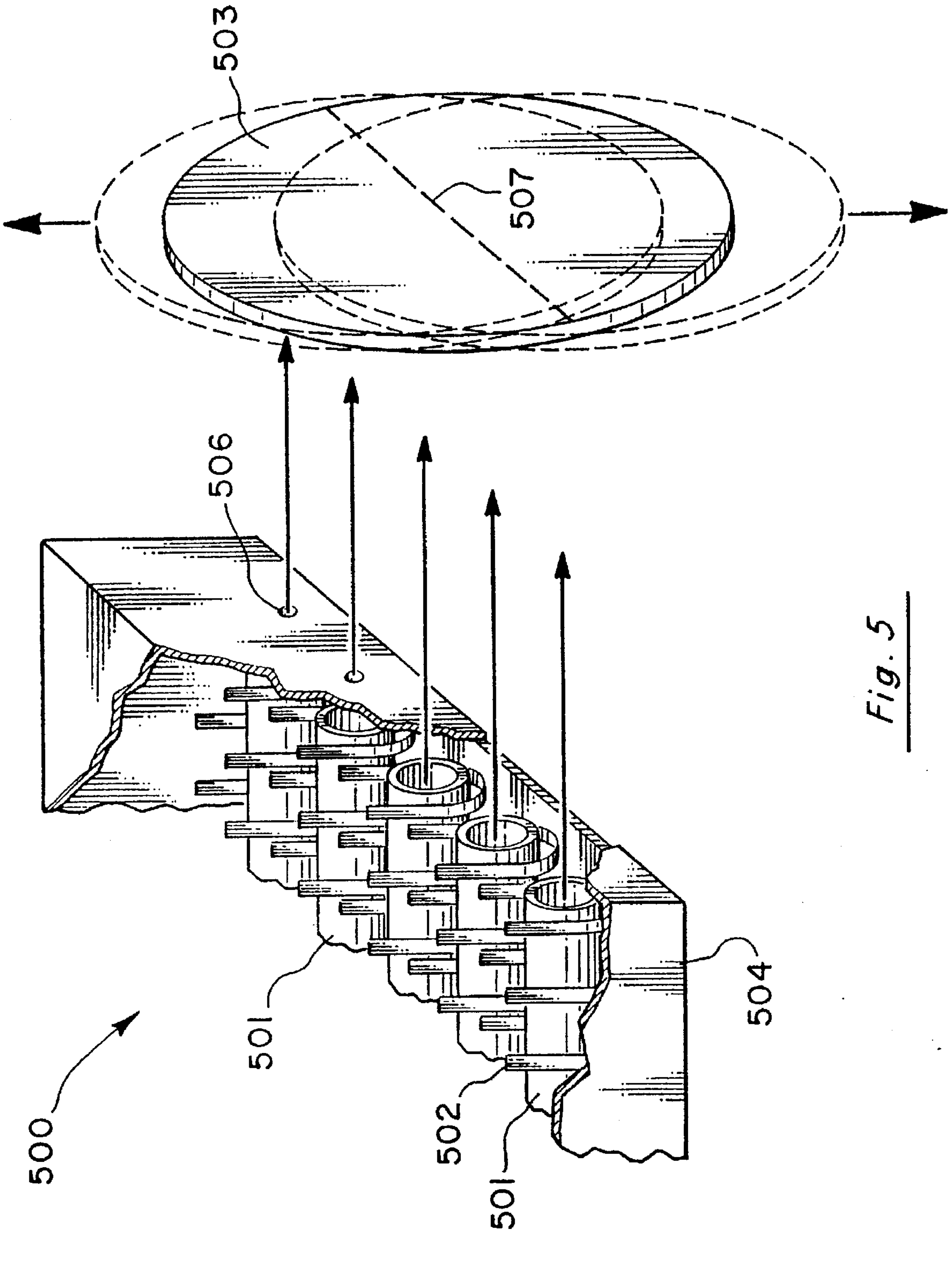
FIG. 5 shows a one dimensional array in accordance with an embodiment of the present invention.

A large area neutral beam generator can also be configured in a one dimensional array such as generator 500 shown in FIG. 5. As shown in FIG. 5, a plurality of furnace tubes 501 are arranged in a one dimensional array within housing and heat shield 504. In the embodiment shown in FIG. 5, furnace tubes 501 are heated by electron bombardment from filaments 502 as described earlier.

Neutral beam generator 500 produces a one dimensional array of neutral beams directed at substrate 503. Dashed line 507 indicates where this one dimensional beam array intersects substrate 503. In order to process the entire surface area of substrate 503, it is necessary to move substrate 503 as suggested by the arrows extending up and down from substrate 503 in FIG. 5 and the alternative positions of substrate 503 indicated in phantom in FIG. 5. Alternatively, beam generator 500 may be moved so as to scan the one dimensional beam array across substrate 503. The drive mechanism (not shown) for moving substrate 503 can be implemented using conventional substrate positioning technology used in the semiconductor industry.

It should be understood that other heating methods including resistive and inductive heating may be adapted to the one-dimensional embodiment shown in FIG. 5. For ease of understanding, a reagent gas reservoir, gas supply systems, vacuum systems, and electrical systems are not shown in FIG. 5. These systems are generally described in reference to FIG. 1 and can be adapted to support the embodiment shown in FIG. 5.

It should also be understood that neutral beam generator 500 is preferably used in conjunction with photon source 108 (shown in FIG. 1). Photon source 108 is designed to provide photons at least to a portion of substrate 503 indicated by dashed line 507. This alignment ensures that the photons provided by photon source 108 interact with the one dimensional array of neutral beams.

Figure 6:
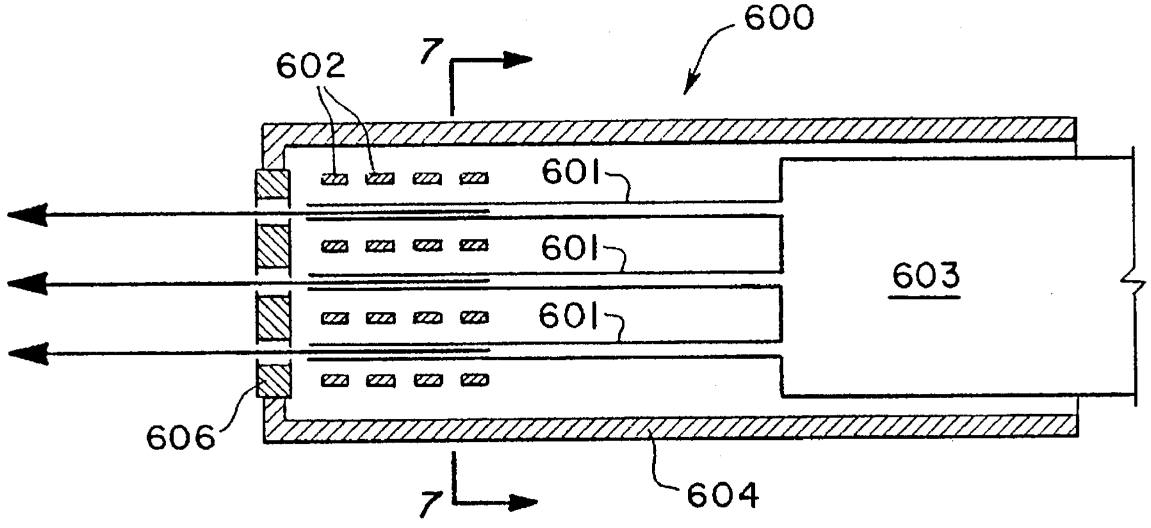
FIG. 6 is a side cross-section view through an alternative embodiment neutral atomic beam array in accordance with the present invention.
Figure 7:
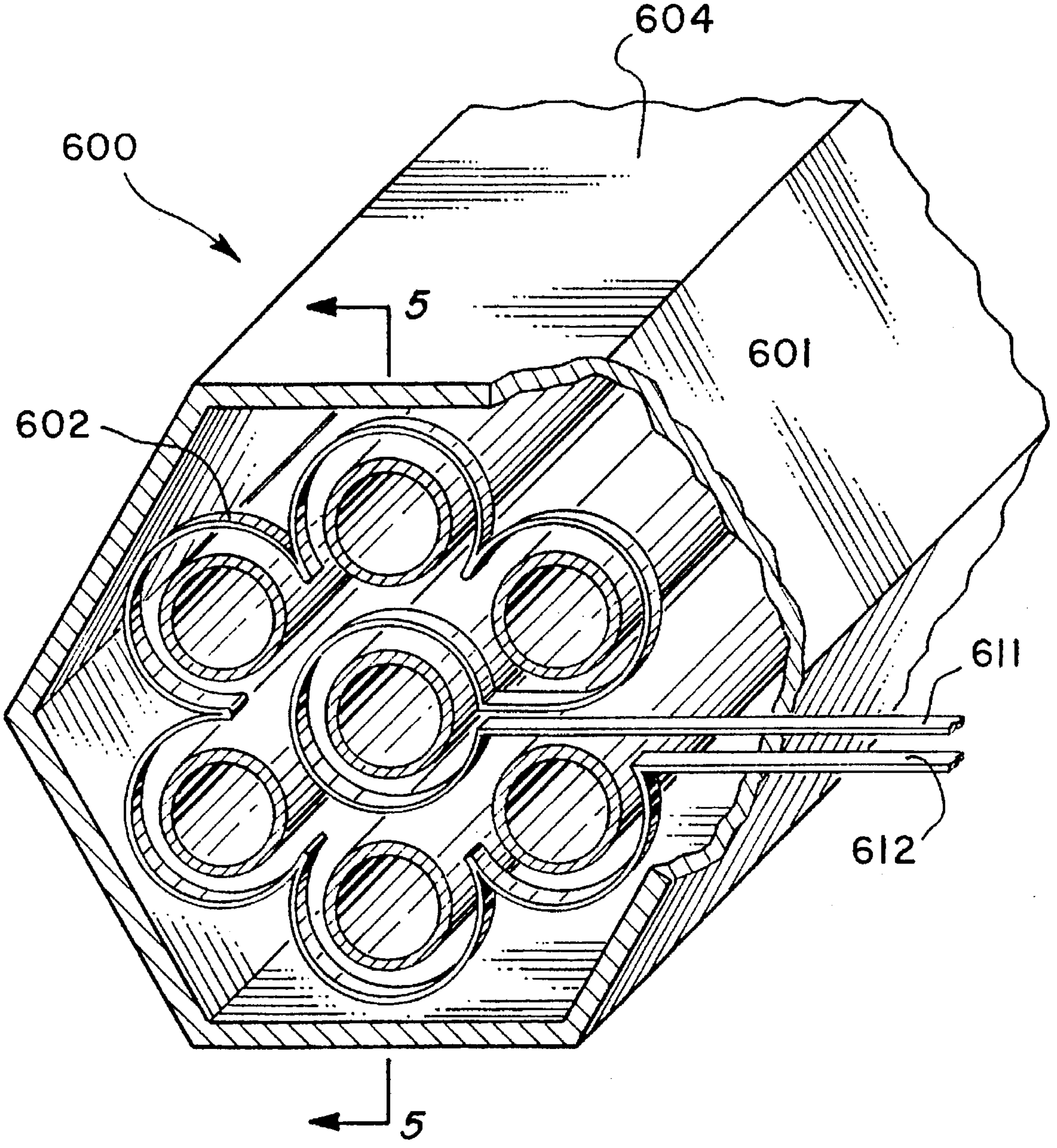
FIG. 7 is a front cross-section view through the neutral reactive beam array shown in FIG. 6.

FIG. 6 and FIG. 7 illustrate a second embodiment large area neutral beam generator 600 for providing multiple beam output in a two dimensional array that utilizes resources somewhat more efficiently and provides a tighter packing density for furnace tubes. As shown in FIG. 6, a plurality of furnace tubes 601 are coupled to a common reservoir 603. At the exit end of each furnace tube 601 filaments 602 serve to heat furnace tube 601 by electron bombardment from filaments 602 as described hereinbefore.

An important feature of the arrangement shown in FIG. 6 is that at least some of the filaments 602 serve to heat more than one furnace tube 601. This minimizes or eliminates the need for individual water cooled shields around each furnace tube 601, and allows a single heat shield 604 to be provided for multiple furnace tube 601. This also allows furnace tubes 601 to be placed closer together thereby reducing the overall energy expense of heating furnace tubes 601. An aperture plate 606 which is mounted to shield/housing 604 can be formed as a plate with multiple apertures formed in alignment with each furnace tube 601. This again simplifies the design of the component parts of the neutral beam generator and allows higher packing density and greater space efficiency while still allowing a completely scaleable design.

Preferably, large area neutral beam generator 600 is also used in conjunction with a photon source 108 (shown in FIG. 1). Photon source 108 should be designed to emit photons so as to intersect with all of the two dimensional array of neutral beams provided by generator 600 near the surface of a substrate 102 (shown in FIG. 1).

FIG. 7 illustrates a cross section of the furnace assembly 600 shown in FIG. 6 showing one possible arrangement for providing an array of furnace tubes within a single housing. As shown in FIG. 7, seven furnace tubes 601 are provided inside a single housing 604. Each filament 602 comprises a serpentine arrangement surrounding furnace tubes 601 so that a single current passed from terminal 611 to terminal 612 heats the entire filament 602 causing electron bombardment and heating of all of furnace tubes 601.

In many cases, filament 602 will be quite soft when heated, and will require supports (not shown) in the form of high temperature wires, ceramic posts, or the like to maintain separation between filament 602 and furnace tubes 601. The shape and material choice for these supports will vary greatly depending on the particular configuration chosen. Where filament 602 is formed from a sufficiently rigid material such as tungsten, supports may be unnecessary. Importantly, filaments 602 may be shaped and supported in any convenient matter to supply electron bombardment of furnace tubes 602.

The particular geometry shown in FIG. 7 is simply an example and not meant to be a limitation in any way on the teachings of the present invention. Any geometry may be used and it should be apparent that a greater or lesser number of furnace tubes 601 could be heated by a single filament 602. Likewise, more or less furnace tubes 601 could be placed inside a single heat shield 604. Also, multiple furnace assemblies 600 could be combined in the single system to provide further scaling improvements. These and other modifications which would be apparent to those of skill in the art are encompassed within the teaching and claims of the present invention.

Figure 8:
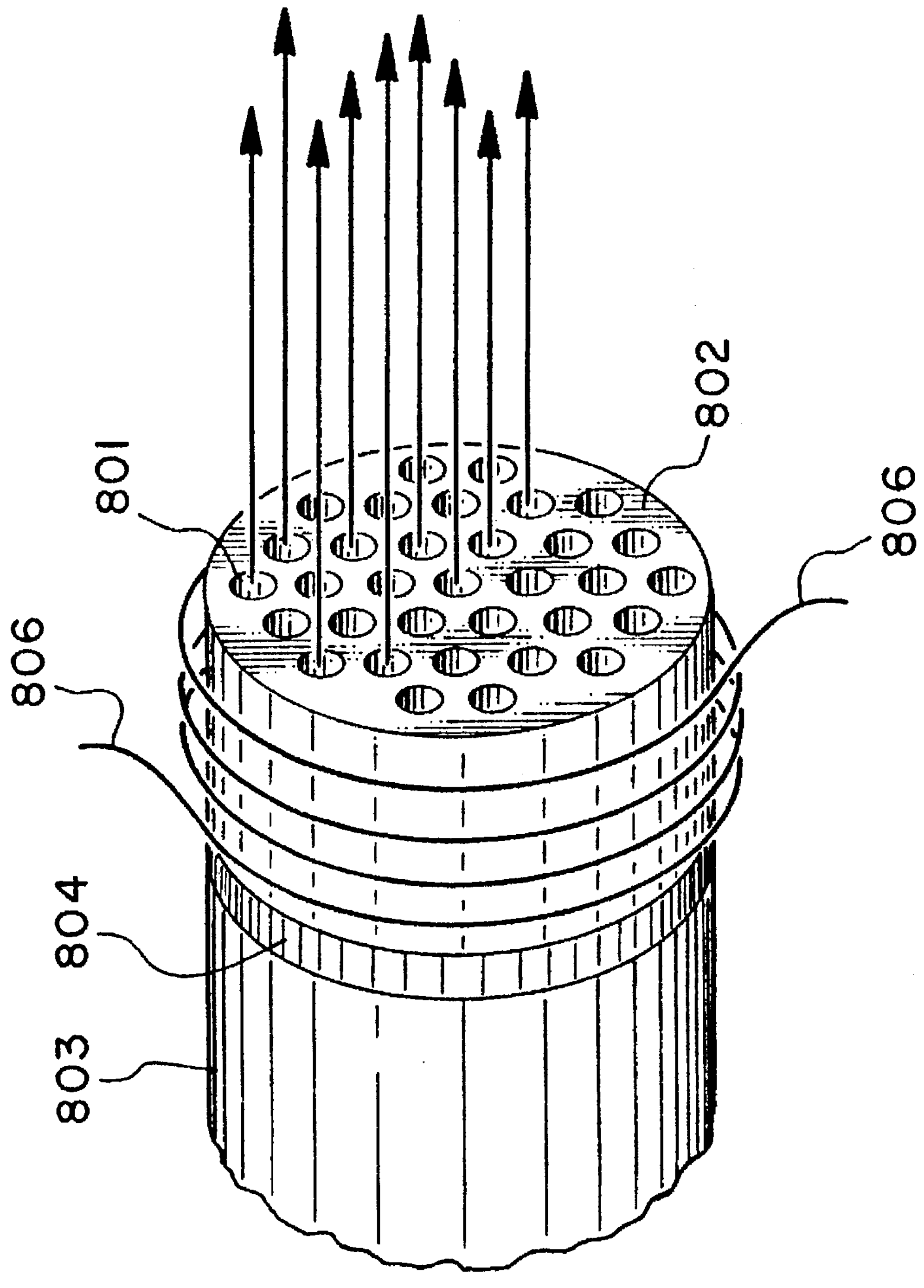
FIG. 8 illustrates an alternative embodiment two dimensional array in accordance with the present invention.

Another alternative design to provide a two dimensional array of neutral beams is illustrated by neutral beam generator 800 shown in FIG. 8. In this embodiment, a plurality of furnace tubes 801 are formed by holes machined into an otherwise solid furnace block 802. Furnace block 802 is coupled directly or indirectly to reagent gas reservoir 803 that serves to provide reagent molecules to furnace tubes 801. A thermally and electrically insulating connector 804 is preferably used to thermally and electrically isolate furnace block 802 from reservoir 803. Connector 804 may be formed from a ceramic or composite material, for example. Preferably, connector 804 is ring shaped or formed as a disk with multiple holes formed therein to allow gas to pass from reservoir 803 to furnace tubes 801.

In the embodiment shown in FIG. 8, furnace block 802 is heated by inductive heating. This is accomplished by passing alternating current through inductive heating coils 806. Basic principles and operation of inductive heating are well known and need not be fully described here to understand the present invention. However, until now, inductive heating has not been used in conjunction with the other features of the present invention to provide neutral atomic beams. Inductive heating may be adapted to any of the embodiments previously described.

Regardless of the particular heating method used, it is important that the interior surface of furnace tubes 801 (or furnace tubes 601 in FIG. 6, furnace tubes 501 in FIG. 5, or furnace tubes 401 in FIG. 4) be heated to a temperature sufficient to dissociate the gas into neutral components. Dissociation occurs when gas molecules impact the interior surface of furnace tubes 401, 501, 601 and 801. Any convenient method of heating, or a combination of heating methods, that can bring this interior surface to temperatures of 1500–2500 Celsius is acceptable.

The above disclosure sets forth a number of embodiments of the present invention. Other arrangements or embodiments, not precisely set forth, could be practiced under the teachings of the present invention as set forth in the following claims. It is to be understood that the claimed invention is not to be limited to the description of the preferred embodiments but encompasses other modifications and alterations within the scope and spirit of the inventive concept.

We claim:

1. A method for processing semiconductor wafers comprising the steps of:

providing a semiconductor substrate having a surface;

providing a reservoir of reagent molecules;

heating the reagent molecules sufficiently to form thermally excited electrically neutral atomic particles;

directing the neutral atomic particles into a plurality of collimated parallel beams aimed at the semiconductor substrate surface; and illuminating the substrate surface with photons having a preselected wavelength and intensity.

2. The method of claim 1, further comprising the steps of:

flowing the reagent molecules from the reservoir to a plurality of furnace tubes;

heating only a portion of each of the plurality of furnace tubes by electron bombardment to dissociate the reagent molecules into neutral atomic particles.

3. The method of claim 1 wherein the step of directing the neutral atomic particles comprises:

confining the reagent molecules in a hollow tube;

heating an inner surface of the hollow tube to give the reagent molecules thermal energy as they impact the hollow tube, wherein the heating step is performed so as to dissociate the reagent molecules and minimally ionize the products of dissociation, wherein the thermal energy causes the tube so as to form a beam of neutral atomic particles exiting one end of the tube.

4. The method of claim 3 wherein the heating step comprises inductive heating.

5. The method of claim 3 wherein the heating step comprises bombarding the hollow tube with electrons.

6. The method of claim 3 wherein the heating step comprises resistively heating the hollow tube.

7. A method for processing the surface of semiconductor substrate comprising the steps of:

providing a reservoir of reagent molecules;

heating the reagent molecules sufficiently to form thermally excited electrically neutral atomic particles;

directing the thermally excited electrically neutral atomic particles into a plurality of collimated parallel beams for delivery to the semiconductor substrate surface so as to cause a desired surface reaction; and illuminating the semiconductor substrate surface with photons having a preselected wavelength and intensity during the step of directing the neutral atomic particles thereby enhancing the desired surface reaction.

8. The method of claim 7 further comprising the steps of:

flowing the reagent molecules from the reservoir to a plurality of furnace tubes;

heating only a portion of each of the plurality of furnace tubes by electron bombardment to dissociate the reagent molecules into the electrically neutral atomic particles.

9. The method of claim 7 wherein the step of directing the neutral atomic particles comprises:

confining the reagent molecules in a hollow tube;

heating an inner surface of the hollow tube to give the reagent molecules thermal energy as they impact the hollow tube, wherein the heating step is performed so as to dissociate the regent molecules and minimally ionize the products of dissociation, wherein the thermal energy causes the dissociated regent molecules to interact with the inside wall of the tube so as to form a beam of neutral atomic particles exiting one end of the tube.

10. The method of claim 7 wherein the step of illuminating the semiconductor surface with photons comprises illuminating the surface with a plurality of photons sources.

11. The method of claim 7 wherein the step of illuminating the semiconductor surface with photons occurs according to a pulsed emission.

12. The method of claim 7 wherein the desired surface reaction is cleaning of the surface of the substrate.

13. The method of claim 7 wherein the desired surface reaction is etching of the surface of the substrate.

* * * * *